(12) United States Patent
Wilson

(10) Patent No.: US 8,244,195 B2
(45) Date of Patent: Aug. 14, 2012

(54) LOW NOISE AMPLIFIER

(75) Inventor: David Wilson, Dunfermline (GB)

(73) Assignee: Elonics Limited, Livingston (GB)

( * ) Notice: Subject to any disclaimer, the term of this patent is extended or adjusted under 35 U.S.C. 154(b) by 71 days.

(21) Appl. No.: 12/937,573

(22) PCT Filed: Mar. 25, 2009

(86) PCT No.: PCT/GB2009/050278
§ 371 (c)(1),
(2), (4) Date: Dec. 9, 2010

(87) PCT Pub. No.: WO2009/127847
PCT Pub. Date: Oct. 22, 2009

(65) Prior Publication Data
US 2011/0105067 A1 May 5, 2011

(30) Foreign Application Priority Data
Apr. 18, 2008 (GB) .................................. 0807149.0

(51) Int. Cl.
*H04B 7/06* (2006.01)
*H04K 3/00* (2006.01)
(52) U.S. Cl. ...................................... 455/253.2; 330/305
(58) Field of Classification Search ............... 455/232.1, 455/234.1, 234.2, 253.2; 330/126, 305, 310
See application file for complete search history.

(56) References Cited

U.S. PATENT DOCUMENTS

| | | |
|---|---|---|
| 2004/0145415 A1 | 7/2004 | Sun |
| 2008/0218273 A1* | 9/2008 | Uehara et al. .................. 330/306 |
| 2010/0045379 A1* | 2/2010 | Zhan .............................. 330/253 |

FOREIGN PATENT DOCUMENTS

| | | |
|---|---|---|
| GB | 2423875 A | 9/2006 |
| GB | 2436651 A | 10/2007 |
| WO | WO-2007/016552 A1 | 2/2007 |

OTHER PUBLICATIONS

Bruccoleri, Federico, "Wide-Band Low Noise Amplifier Techniques in CMOS", ISBN: 90-365-1964-0, 2003, pp. 72-75, 152-153.
Dong-Gu Im, et al., "A Wide-Band CMOS Variable-Gain Low Noise Amplifier for Multi-Standard Terrestrial and Cable TV Tuner", Radio Frequency Integrated Circuits (RFIC) Symposium, 2007 IEEE, IEEE, Piscataway, NJ, USA, Jun. 1, 2007, pp. 621-624.
Seong-Sik Song, et al., "A Highly Linear Wideband CMOS Low-Noise Amplifier Based on Current Amplification for Digital TV Tuner Applications", IEEE Microwave and Wireless Components Letters, IEEE Service Center, New York, NY, US, vol. 18, No. 2, Feb. 1, 2008, pp. 118-120.
Fritzsche, H., "International Search Report" for PCT/GB2009/050278 as mailed Oct. 5, 2009, 6 pages.
Bruccoleri, F., "Wide-Band CMOS Low-Noise Amplifier Exploiting Thermal Noise Cancelling", IEEE Journal of Solid State Circuits, vol. 39, No. 2, Feb. 2004, pp. 275-282.

* cited by examiner

*Primary Examiner* — Lee Nguyen
(74) *Attorney, Agent, or Firm* — Winstead PC

(57) ABSTRACT

A wideband tuneable low noise amplifier that is capable of receiving signals over a wide range of frequencies, providing tuneable filtering to remove out of band interferer signals, and providing variable gain for a wide range of frequencies. To accommodate variable gain, the low noise amplifier has an amplifier stage comprising two gain stages, and the relationship between the gain stages is controlled responsive to changes in the voltage gain of an input stage. Linearity monitoring combined with Q-enhance may be employed to increase performance at low signal levels.

20 Claims, 5 Drawing Sheets

LOW NOISE AMPLIFIER

The present invention relates to a low noise amplifier for an electronic circuit, and in particular a wideband tuneable low noise amplifier which provides variable gain.

Low noise amplifiers (LNAs) are used to amplify the typically weak signal received by an antenna. The Friis formula for noise figure determines the total noise figure of an array of components within a system, the effect of which is that the noise contribution at the receiver front end is most critical. A low noise amplifier employed shortly after receipt of a signal by the antenna serves to minimise the subsequent noise figure contribution by, for example, the mixer or other component to which the signal is passed.

"Wide-Band CMOS Low-Noise Amplifier Exploiting Thermal Noise Cancelling" (Bruccoleri, F, IEEE Journal of Solid State Circuits, Vol. 39, No. 2, February 2004, pp. 275-282) illustrates an example of a particularly effective noise-cancelling technique in which (see FIG. 1) the gain of the inverting amplifier stage 1 is set to be identical to the potential divider effect of resistances 3 and 5 (note that resistance 5 is the source impedance, for example the impedance of an aerial, which is external to the amplifier); the result of which is that the noise contributed by MOSFET 7 is cancelled by the summing stage 9. Essentially, the noise is fed forward and removed by summing the noise with the inverted fed-forward noise.

FIG. 2 illustrates a (simplified) schematic for an LNA exploiting this noise-cancelling technique. Essentially, the paths from points X and Y are summed (by source follower MOSFET 17 and the gain stage MOSFETs 19 and 21) at the output 11 in such a way that the thermal noise contribution of MOSFETS 13 and 15 is cancelled.

In the field of communications, a vast array of radio standards are now employed which range from the low megahertz region to the high gigahertz region, dependent on the application. For example, FM radio generally operates in the region of 87.5 to 108.0 MHz and television in Western Europe typically operates in the region of 450 to 900 MHz. Wireless networking protocols operate at higher frequencies, with Bluetooth operating in the 2.4 to 2.4835 GHz. WiFi operates in the same area, i.e. 2.4 GHz, although long-range WiFi may also make use of 5 and 10 GHz modes.

FIG. 3 is a simplified block diagram of conventional multi-standard system which is capable of operating on a number of difference frequency bands. This typically requires several antennas (e.g. A1,A2,A3) connected via several input pins (e.g. I1,I2,I3) to suitably configured or designed LNAs (e.g. LNA1, LNA2, LNA3). A switch S is operable to select which signal is passed to the mixer M and thereafter subject to amplification.

Because of the wide variety of radio standards, there is a desire to develop a single RF tuner which can receive signals across all (or at least a multitude) of the available ranges. However, this is not easily realised—the tuner must have a low noise figure to achieve the sensitivity required by the various standards and protocols, and this must be achievable across all the frequencies in the range. In addition, the tuner must exhibit high linearity and appropriate filtering to operate in the presence of interferer signals, of which (for a very wideband system) there are many.

It is therefore an object of the present invention to provide a low noise amplifier that is capable of receiving signals over a wide range of frequencies.

It is another object of the present invention to provide a low noise amplifier which provides tuneable filtering to remove out of band interferer signals from a wide range of frequencies.

It is a yet further object of the present invention to provide a low noise amplifier which provides variable gain for a wide range of frequencies.

According to a first aspect of the present invention, there is provided a low noise amplifier circuit for a radio frequency tuner, the circuit comprising:

an input stage adapted to receive a signal;
an amplifier stage adapted to amplify the signal; and
the amplifier stage comprising two gain stages;
wherein the circuit further comprises first control means to control the voltage gain of the input stage and second control means adapted to control the relationship between the two gain stages responsive to changes in the voltage gain.

To accommodate variable gain in the low noise amplifier circuit, the relationship between the two gain stages is controlled responsive to changes in the gain in the input stage.

Most preferably, the two gain stages are configured so as to remove noise present in the signal.

Optionally, the gain stages are common source gain stages.

Optionally, one or both of the gain stages comprise a plurality of amplifier stages.

Most preferably, a first of the gain stages amplifies and inverts both the signal and noise on the signal and the second of the gain stages amplifies and inverts both the noise on the signal and the inverted signal, such that when the outputs of the two gain stages are subtracted the signal is amplified and the noise is removed.

The invention has particular application where the gain stages are used for noise cancellation, where it enables the noise cancelling operation of the low noise amplifier circuit to be maintained even when the input gain is changed. It also allows for larger signal swings to be accommodated within the system without losing linearity.

Preferably, the input stage comprises a voltage divider including a variable resistance arranged so as to permit variation of the voltage gain of the input stage.

Preferably, the first control means is adapted to control the variable resistance.

Most preferably, the input stage further comprises a current source.

Optionally, the first control means is adapted to control the current source.

Most preferably, the current source is arranged such that variation in the output of the current source causes a variation in the impedance of the input stage.

Preferably, the second control means is adapted to vary the transconductance of at least part of one or both of the two gain stages.

Preferably, the second control means maintains a ratio of the transconductances of at least a part of each of the two gain stages.

Preferably, the second control means is adapted to scale the ratio of the transconductances of the two gain stages responsive to the variation in the voltage gain of the input stage.

Preferably, the second control means scales the ratio of the transconductances of the two gain stages in direct relation to the scaling of the voltage divider within the input stage.

Preferably, one or both of the two gain stages comprises a transistor.

Preferably, the circuit further comprises a controller which comprises one or both of the first and second control means.

The controller may be a microprocessor, DSP or FPGA.

Preferably, the circuit further comprises a frequency dependent load.

Preferably, the frequency dependent load comprises a plurality of tanks, each configured to permit low noise amplification at a predetermined range of frequencies.

Preferably, the frequency dependent load comprises one or more switches adapted to select one or more of the tanks so as to achieve a coarse frequency tuning.

Preferably, at least one of the tanks comprises an inductor and a capacitor.

Optionally, at least one of the tanks comprises a resistor and a capacitor.

Most preferably, the capacitance of the capacitor is variable so as to achieve a fine frequency tuning.

Alternatively, the inductance can be adjusted so as to achieve a fine frequency tuning.

Further alternatively, the resistance can be adjusted so as to achieve a fine frequency tuning.

Optionally, the circuit further comprises a linearity monitor adapted to monitor current swing in one or both of the input stage and the amplifier stage.

Preferably, the linearity monitor comprises a mirror transistor arranged so as to exhibit a current swing substantially the same as the current swing within the input stage.

Preferably, the linearity monitor monitors the current swing in the mirror transistor and controls the gain of the amplifier stage responsive to the current swing.

Preferably, the linearity monitor is adapted to reduce the gain of the amplifier stage when the current swing approaches or exceeds a predetermined upper threshold value.

Preferably, the linearity monitor is adapted to increase the gain of the amplifier stage when the current swing approaches or decreases below a predetermined lower threshold value.

Most preferably, the linearity monitor is adapted to control the gain of the amplifier stage responsive to the amplitude of the current swing so as to maintain operation of the amplifier stage within a linear range.

Optionally, the circuit further comprises a q-enhance circuit.

Optionally, the q-enhance circuit comprises a cross coupled differential pair of transistors connected to a load.

Preferably, the load is a frequency dependent load.

Preferably, the linearity monitor is further adapted to selectively apply the q-enhance circuit to the load.

Preferably, the linearity monitor is adapted to apply the q-enhance circuit to the load dependent on the amplitude of the current swing.

Preferably, the linearity monitor is adapted to selectively apply the q-enhance circuit to the load when the current swing is below a predetermined threshold value.

According to a second aspect of the present invention, there is provided a multi-standard tuning system comprising the low noise amplifier circuit of the first aspect.

Preferably, the system includes at least one receiver adapted to receive one or more signals, the low noise amplifier circuit configured so as to optimise low noise operation for at least one frequency or range of frequencies of the one or more signals.

Preferably, the system comprises a wideband receiver.

Alternatively, the system comprises a plurality of receivers and a switch capable of selecting an input signal to the low noise amplifier circuit from one or more of the receivers.

The present invention will now be described by way of example only and with reference to the accompanying figures in which.

Figure 4:
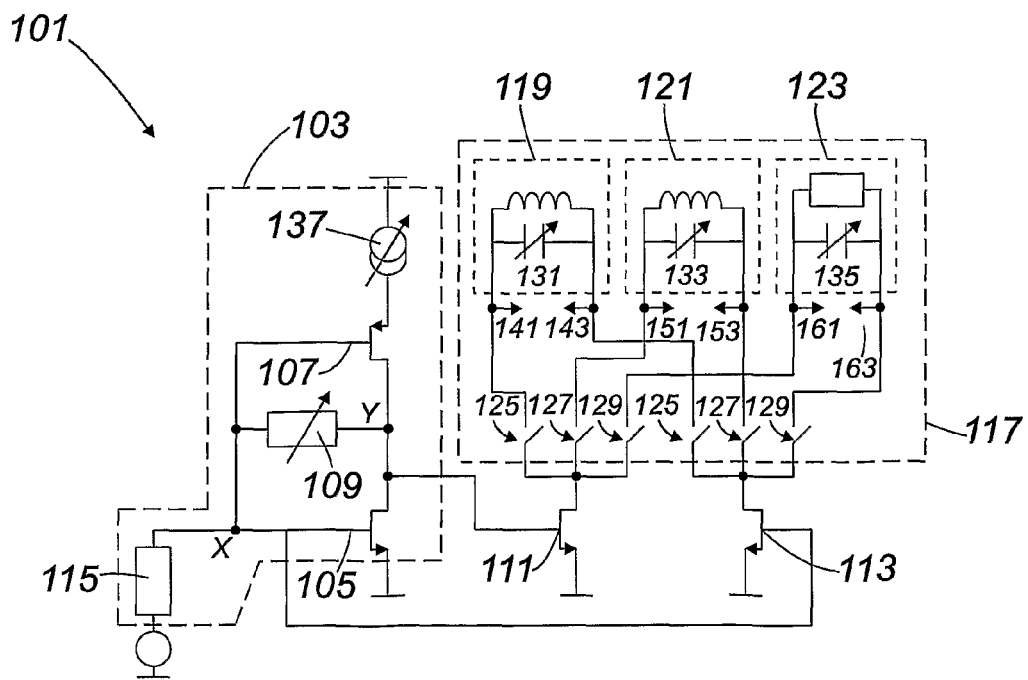
FIG. 4 illustrates in schematic form a noise cancelling low noise amplifier in accordance with the present invention.

With reference to FIG. 4, there is presented a low noise amplifier 101 which is capable of noise cancelling, and which exhibits variable gain and linearity, has a tuneable frequency response, and adjustable input impedance. The amplifier 101 comprises an input stage 103 which exhibits a voltage gain of approximately $A_V = 1 - (g_m \cdot R_{VAR})$, where $g_m$ is the combined transconductance of transistors 105 and 107 and $R_{VAR}$ is the resistance of resistor 109.

In this embodiment, the resistor 109 is programmable. As the potential divider effect between points X and Y in the input stage 103 is governed by the ratio of resistors 109 and 115, the programmable (and therefore variable) nature of the resistor 109 allows the potential divider effect to be controlled.

To achieve noise cancellation the relationship between common source gain stages 111 and 113 must be scaled with that potential divider effect. Therefore the ratio of the respective transistors 113 and 111 must vary in response to variations in the resistance of programmable resistor 109. This is achieved by controlling the transconductance of the transistors 111, 113.

One way in which the variable transconductances may be controlled is by switching in multiple transistors in parallel with 111 and 113, in a way which varies the ratios between 111 and 113. The switches would be similar to 125,127,129. The skilled man will readily appreciate that there are other ways of achieving this effect, which might include varying the bias conditions of the transistors themselves.

FIG. 4(a) illustrates an example of the gain variation that can be achieved by controlling resistor 109 and transistors 111,113.

To achieve noise cancellation, the low noise amplifier employs a frequency dependent load 117. This comprises a series (in this example three) of loads 119, 121, 123 which can be selectively introduced into the circuit 101 by respective switches 125, 127, 129. This provides a method of coarse tuning the load dependent on the frequency of interest. Fine tuning can be achieved by varying the capacitive load using variable capacitors 131, 133, 135. The number of loads can be modified depending on the RF standard in which the low noise amplifier 101 is intended to operate. In RF applications this is of great benefit as by allowing selection of the load dependent on the frequency allows significant attenuation of unwanted interferers in a wide range of frequency bands.

FIG. 5(b) illustrates an example of the frequency response of the tuning which may be permitted by varying the capacitive load of 131 and/or 133. The gain curve can therefore be shifted so as to coincide with the centre frequency of the signal (or signals) of interest to maximise the gain achieved.

Figure 5:
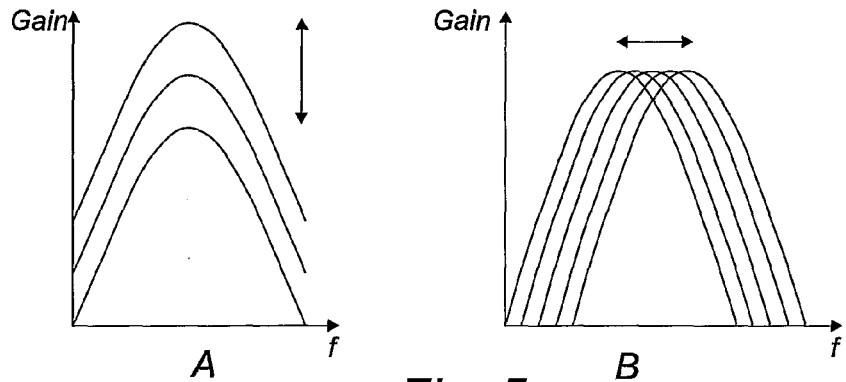
FIG. 5 illustrates an exemplary frequency response of the low noise amplifier of FIG. 4.

Note that the capacitive load of 135 would exhibit a low pass response different from FIG. 5(*b*).

Thereafter, differential output pairs 141-143, 151-153 and 161-163 may be used separately, or switched through a single output stage to combine two or more differential outputs to achieve a desired output.

As commented above, the input stage 103 should exhibit a low noise figure. However, generally this is difficult to maintain for both low power signals and high power signals without compromising the linear response at the high power end. To increase linearity at the high end, it is sometimes desirable to increase power consumption or compromise on the noise performance. In this embodiment, this is achieved by using current source 137 which is also programmable. Increasing the current from source 137 enables transistors 105,107,111, 113 to accommodate larger signal swings without loss of linearity. Furthermore, as the relationship between the transconductances of transistors 111,113 remains constant, this can be achieved while sustaining the noise cancellation effect.

Another advantage of the programmable nature of current source 137 is that impedance matching of the input stage 103 and the signal source (e.g. an antenna) can be achieved. By adjusting the current the transconductance of the transistors 105,107 can be adjusted; as the impedance is inversely proportional to the transconductance of the transistors 105,107 increasing the current reduces the impedance of the input stage 103.

Figure 1:
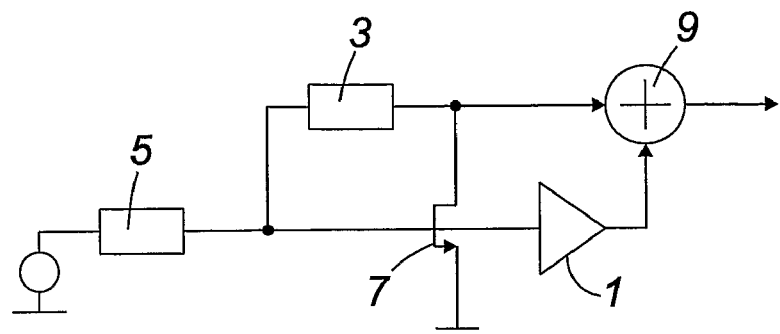
FIG. 1 illustrates in schematic form a noise-cancelling technique in accordance with the prior art.
Figure 2:
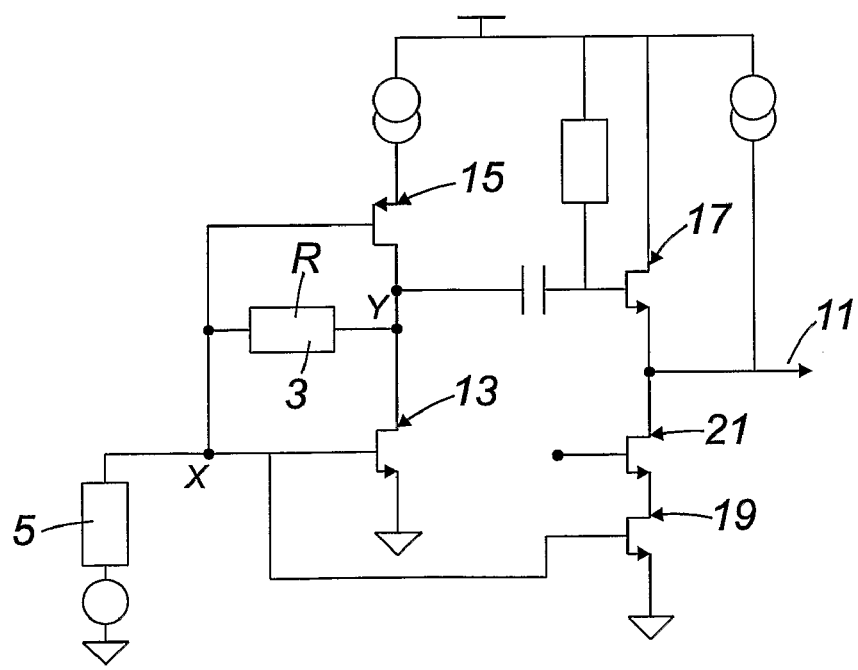
FIG. 2 illustrates in schematic form the noise-cancelling technique of FIG. 1 employed in a low noise amplifier.
Figure 3:
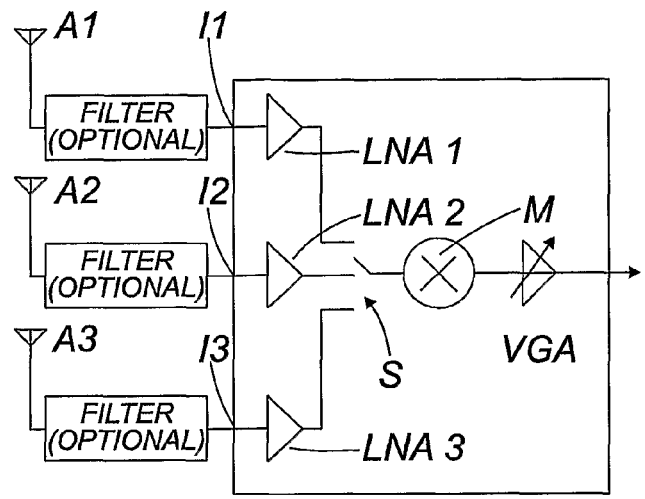
FIG. 3 illustrates in schematic form a conventional multi-standard system which is capable of operating on a number of difference frequency bands.
Figure 6:
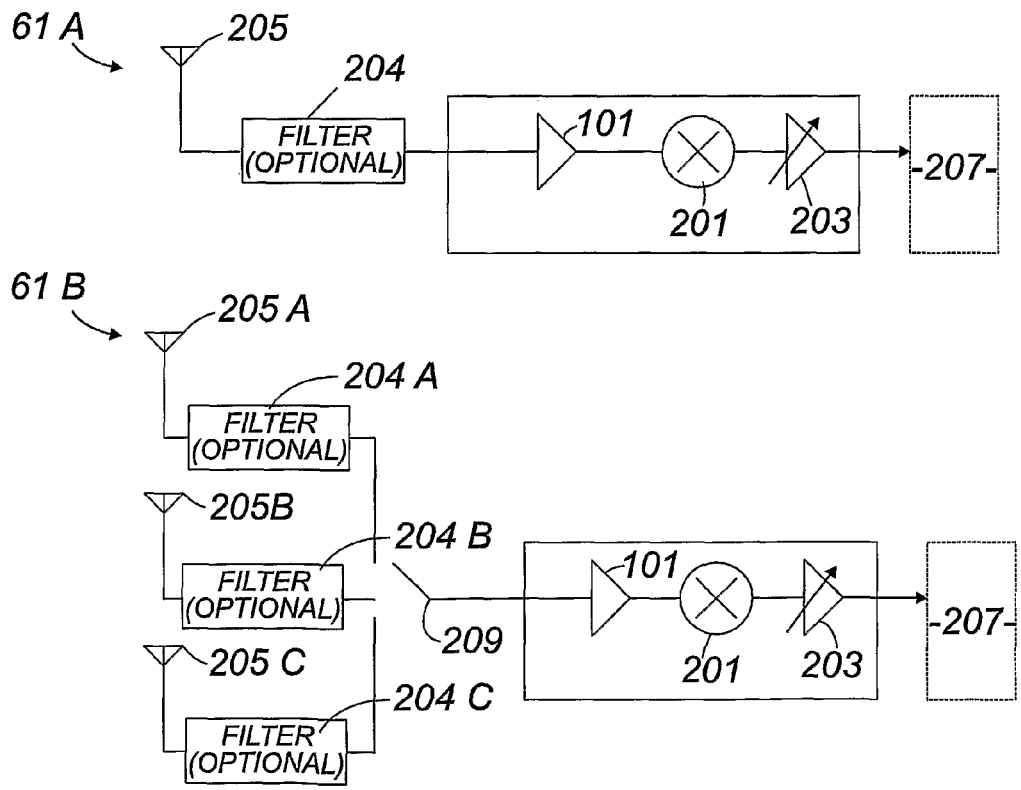
FIG. 6 illustrates two multi-standard systems employing a low noise amplifier according to the present invention.

FIG. 6 illustrates two multistandard systems 61A,61B for the purposes of comparison with FIG. 3. Whereas the system in FIG. 3 required one LNA specific to each antenna, systems 61A,61B require only a single LNA 101, corresponding to the LNA illustrated in FIG. 3. Not only does this reduce the number of sub-systems required in, say, a tuner, but it has the direct consequence that the tuner demands less in the way of real estate in a larger circuit arrangement (more LNAs requires a larger die to accommodate them), but also requires only a single input pin, rather than one for each LNA necessitated by a different protocol.

System 61A (FIG. 6(*a*)) comprises a wideband antenna 205 capable of receiving signals across a wide range of frequencies. The received signal(s) are passed through an optional filter 204 before arriving at the LNA 101. In accordance with the description of FIG. 4 above, the LNA 101 is programmable so as to allow low-noise amplification across a wide range of frequencies. LNA 101 is therefore tuned for operation on a particular frequency or band of frequencies which is/are isolated from the rest of the frequencies picked up by the wideband antenna 205. The amplified signal is thereafter passed to a mixer 201 and a variable gain amplifier 203 before being passed on as the input to another subsequent system 207.

System 61B (FIG. 6(*b*)) differs from 61A in that it comprises a number of antennae 205A,205B,205C which operate in narrower frequency bands than the wideband antenna 205 of 61A. A switch 209 is operable to select which of the antennae 205A,205B,205C the signal is taken from, and provides a simple way of switching between protocols.

Figure 7:
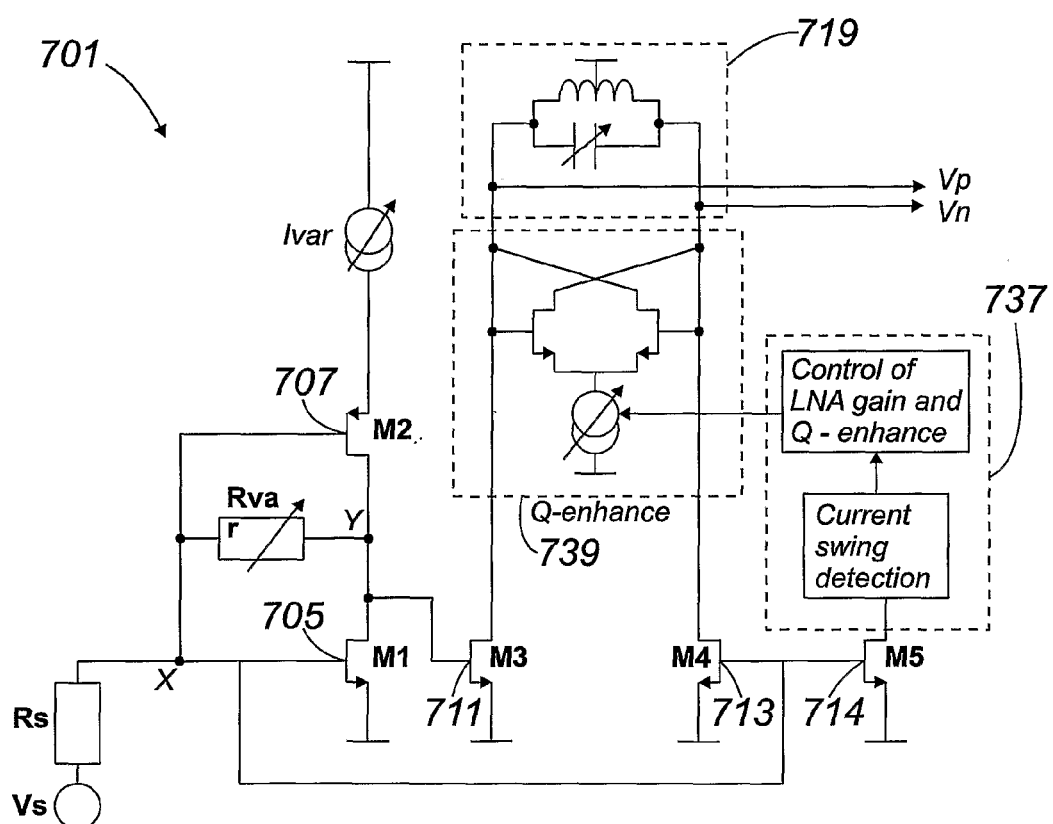
FIG. 7 illustrates in schematic form an alternative low noise amplifier according to the present invention which employs linearity monitoring and Q-enhance.

FIG. 7 illustrates an alternative low noise amplifier circuit 701. This LNA 701 is configured for use at a single frequency band for the purposes of illustration by fixing the load 719.

This circuit 701 employs both linearity monitoring and a technique known as Q-enhance, so as to increase performance at low signal levels. It will be appreciated that the LNA 701 is limited by the current swing through the transistors 705,707,711,713 (corresponding to 105,107,111,113 in the LNA of FIG. 4). In a multi-standard application, the LNA 701 is likely to have to accommodate signals across a wide range of frequencies and a wide range of amplitudes. When the signal of interest is of high power, low gain is preferable to avoid moving into the non-linear operating range of the amplifier. Conversely, if the signal is of low power, higher gain is preferable.

A linearity monitor 737 is therefore employed to optimise the gain of the LNA 701. The current swing in transistors 705,707,711,713 should be maintained beneath a certain limit so as to remain within the linear operating range. Due to the relationship between the transistors 705,707,711,713 (the current in 705 and 707 will be largely the same, and 705, 711 and 713 are scaled in relation to one another to maintain optimum noise cancellation) the percentage swing on each device 705,707,711,713 will be comparable. A mirroring device, transistor 714, is added which operates with the same proportional current swing as 705. This current swing, and in particular the peak current swing, is detected by the linearity monitor 737 and the gain controlled in response thereto. If the current swing on transistor 714 is large, the linearity monitor 737 can decrease the gain if it threatens to move into non-linearity. Likewise, if the current swing on transistor 714 is low, the gain can be safely increased.

When the linearity monitor 737 detects that the current swing on transistor 714 is low, corresponding to a low power signal, it can selectively activate the Q-enhance circuit 739 within the LNA 701. In this example, the Q-enhance circuit 739 comprises a cross-coupled transistor pair which compensates for the losses in the load 719. The quality factor of the load 719 (in this example an LC tank) can thereby be improved. For multi-standard applications where there are likely to be a number of such loads, selectable by (lossy) switches, each load can be provided with its own Q-enhance circuit to improve the overall quality factor.

It is known that the cross-coupled pair can reduce the linearity of the low noise amplifier and introduce distortions when large signals are present. However, this limitation is overcome by selectively activating the Q-enhance circuit dependent on the size of the input signal (i.e. using the monitored signal swing to control when Q-enhance is applied so as to avoid compromising linearity). This is illustrated schematically in FIG. 8, and is particularly useful for wide-band RF systems where a large variation of sensitivity and linearity requirements are anticipated and the system must be able to accommodate rapidly changing signal strengths.

Figure 8:
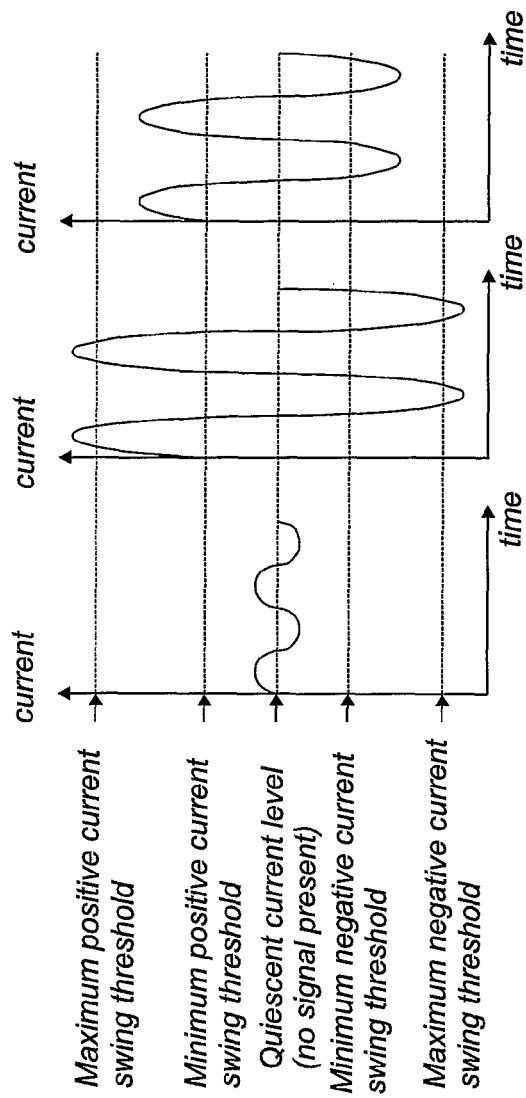
FIG. 8 illustrates exemplary current swing behaviour within the low noise amplifier of FIG. 7 and the threshold settings required.

FIG. 8(*a*) illustrates the case where the current swing on transistor 714 is below a minimum threshold value. In this situation Q-enhance can be enabled and the gain can be increased. FIG. 8(*b*) illustrates the situation where the current swing on transistor 714 is above a maximum threshold. In this situation, Q-enhance (if enabled) should be disabled and the gain should be decreased. FIG. 8(*c*) illustrates the situation where the current swing on transistor 714 is within the threshold limits, at which time Q-enhance is switched off so as to avoid any signal distortion.

Further modifications and improvements may be added without departing from the scope of the invention as defined by the appended claims.

The invention claimed is:

1. A low noise amplifier circuit for a radio frequency tuner, the circuit comprising:
   an input stage adapted to receive a signal;
   an amplifier stage adapted to amplify the signal;
   the amplifier stage comprising two gain stages;
   wherein the input stage comprises a variable resistance arranged so as to permit variation of the voltage gain of the input stage;

wherein the circuit further comprises a controller that varies the transconductances of one or both of the gain stages such that the ratio of the transconductances of the two gain stages is scaled responsive to the variation in the voltage gain of the input stage; and wherein a first of the gain stages amplifies and inverts both the signal and noise on the signal and a second of the gain stages amplifies and inverts both the noise on the signal and the inverted signal, such that when the outputs of the two gain stages are subtracted the signal is amplified and the noise is removed.

2. A low noise amplifier circuit as defined in claim 1, wherein one or both of the gain stages comprise a plurality of amplifier stages.

3. A low noise amplifier circuit as defined in claim 1, wherein the input stage further comprises a programmable current source.

4. A low noise amplifier circuit as defined in claim 3, wherein the current source is arranged such that variation in the output of the current source causes a variation in the impedance of the input stage.

5. A low noise amplifier circuit as defined in claim 1, wherein the controller maintains a ratio of the transconductances of at least a part of each of the two gain stages.

6. A low noise amplifier circuit as defined in claim 1, wherein the controller scales the ratio of the transconductances of the two gain stages in direct relation to the scaling of a voltage divider within the input stage.

7. A low noise amplifier circuit as defined in claim 1, wherein the circuit further comprises a frequency dependent load comprising a plurality of tanks, each configured to permit low noise amplification at a predetermined range of frequencies.

8. A low noise amplifier circuit as defined in claim 7, wherein the frequency dependent load comprises one or more switches adapted to select one or more of the tanks so as to achieve a coarse frequency tuning.

9. A low noise amplifier circuit as defined in claim 7, wherein at least one of the tanks comprises an inductor and a capacitor, or a resistor and a capacitor.

10. A low noise amplifier circuit as defined in claim 9, wherein one or more of the capacitance of the capacitor, the inductance of the inductor, and the resistance of the resistor is variable so as to achieve a fine frequency tuning.

11. A low noise amplifier circuit as defined in claim 1, wherein the circuit further comprises a linearity monitor adapted to monitor current swing in one or both of the input stage and the amplifier stage.

12. A low noise amplifier circuit as defined in claim 11, wherein the linearity monitor comprises a mirror transistor arranged so as to exhibit a current swing substantially the same as the current swing within the input stage, or wherein the linearity monitor monitors the current swing in the mirror transistor and controls the gain of the amplifier stage responsive to the current swing.

13. A low noise amplifier circuit as defined in claim 11, wherein the linearity monitor is adapted to reduce the gain of the amplifier stage when the current swing approaches or exceeds a predetermined upper threshold value, and/or wherein the linearity monitor is adapted to increase the gain of the amplifier stage when the current swing approaches or decreases below a predetermined lower threshold value.

14. A low noise amplifier circuit as defined in claim 11, wherein the linearity monitor is adapted to control the gain of the amplifier stage responsive to the amplitude of the current swing so as to maintain operation of the amplifier stage within a linear range.

15. A low noise amplifier circuit as defined in claim 1, wherein the circuit further comprises a q-enhance circuit comprising a cross coupled differential pair of transistors connected to a load.

16. A low noise amplifier circuit as defined in claim 15, wherein the linearity monitor is adapted to selectively apply the q-enhance circuit to the load dependent on the amplitude of the current swing.

17. A low noise amplifier circuit as defined in claim 16, wherein the linearity monitor is adapted to selectively apply the q-enhance circuit to the load when the current swing is below a predetermined threshold value.

18. A multi-standard tuning system comprising the low noise amplifier circuit as defined in claim 1.

19. A multi-standard tuning system as defined in claim 18, wherein the system includes at least one receiver adapted to receive one or more signals, the low noise amplifier circuit configured so as to optimise low noise operation for at least one frequency or range of frequencies of the one or more signals.

20. A multi-standard tuning system as defined in claim 18, wherein the system comprises a wideband receiver or a plurality of receivers and a switch capable of selecting an input signal to the low noise amplifier circuit from one or more of the receivers.

* * * * *